United States Patent [19]

Hiramatsu et al.

[11] Patent Number: 5,311,040
[45] Date of Patent: May 10, 1994

[54] THIN FILM TRANSISTOR WITH NITROGEN CONCENTRATION GRADIENT

[75] Inventors: Masato Hiramatsu, Tokyo; Takaaki Kamimura, Kawasaki; Mitsuo Nakajima, Koshigaya, all of Japan

[73] Assignee: Kabushik Kaisha Toshiba, Kawasaki, Japan

[21] Appl. No.: 70,055

[22] Filed: Jun. 1, 1993

Related U.S. Application Data

[63] Continuation of Ser. No. 673,396, Mar. 22, 1991, abandoned.

[30] Foreign Application Priority Data

Mar. 27, 1990 [JP] Japan .................................. 2-77385
Aug. 15, 1990 [JP] Japan .................................. 2-215491

[51] Int. Cl.⁵ .................. H01L 29/04; H01L 29/36; H01L 29/76; H01L 29/167
[52] U.S. Cl. ........................................ 257/57; 257/66; 257/69; 257/607
[58] Field of Search ............. 357/23.7, 2, 4; 257/57, 257/66, 63, 69

[56] References Cited

U.S. PATENT DOCUMENTS

| | | | |
|---|---|---|---|
| 4,905,066 | 2/1990 | Dohjo et al. | 357/23.7 |
| 4,933,296 | 6/1990 | Parks et al. | 357/23.7 |
| 4,960,719 | 10/1990 | Tanaka et al. | 357/23.7 |
| 4,979,006 | 12/1990 | Tanaka et al. | 357/23.7 |
| 5,017,983 | 5/1991 | Wu | 257/57 |

FOREIGN PATENT DOCUMENTS

| | | |
|---|---|---|
| 0342796 | 11/1989 | European Pat. Off. . |
| 0213169 | 12/1984 | Japan . |
| 59213169 | 12/1984 | Japan . |
| 60-43869 | 3/1985 | Japan . |
| 6043869 | 3/1985 | Japan . |
| 0188969 | 8/1986 | Japan . |
| 61-188969 | 8/1986 | Japan . |
| 62-160769 | 7/1987 | Japan . |
| 6457755 | 3/1989 | Japan . |
| 228624 | 1/1990 | Japan . |

*Primary Examiner*—William Mintel
*Assistant Examiner*—Wael Fahmy
*Attorney, Agent, or Firm*—Oblon, Spivak, McClelland, Maier & Neustadt

[57] ABSTRACT

An inverted stagger thin film transistor includes an insulating substrate, a silicon active layer formed thereon, source and drain ohmic contact layers, source and drain electrodes respectively contacting the source and drain ohmic contact layers, and a gate electrode opposite to the channel region of the active layer through a gate insulating film. An auxiliary film consisting of a silicon film doped with nitrogen is formed in the surface of the active layer, and the ohmic contact layers contact the auxiliary film. The auxiliary film can be continuously formed from the active layer to the ohmic contact layers, thereby improving a junction state between the active layer and the ohmic contact layers.

14 Claims, 6 Drawing Sheets

THIN FILM TRANSISTOR WITH NITROGEN CONCENTRATION GRADIENT

This application is a continuation of application Ser. No. 07/673,396, filed on Mar. 22, 1991, now abandoned.

BACKGROUND OF THE INVENTION

1. Field of the Invention

The present invention relates to a thin film transistor using a silicon active layer.

2. Description of the Related Art

Since display elements such as electroluminescence, a light-emitting diode, a plasma, fluorescence, and a liquid crystal can provide flat panel type display devices, these devices have been demanded to be applied as special-purpose display devices such as terminal display devices of measuring instruments, office machines, and computers. Of these devices, an electroluminescent or liquid crystal display device using a switching element matrix array consisting of thin film transistors has received a great deal of attention as a display device having low power consumption and low cost.

As materials of these switching transistors, single-crystalline, polycrystalline, and amorphous Si, CdSe, Te, CdS, and the like are used. Since a thin film technique in a low-temperature process can be applied to a polycrystalline semiconductor and an amorphous semiconductor of these materials, an active matrix element consisting of switching transistors can be formed on even a substrate as of glass required to be treated at a relatively low temperature, and a large, inexpensive display device has been available.

A thin film transistor (TFT) of this type is described in a literature, e.g., Published Unexamined Japanese Patent Application No. 102560/83.

In the above conventional TFT, amorphous silicon (a-Si) films serving as an active layer and an ohmic contact layer cannot be continuously formed because the steps of forming and patterning a protection film (contributing to an etching process for forming source and drain electrodes separated from each other) interrupt this. As a result, when the protection film is patterned, the active layer is also etched, and a junction between the active layer and the ohmic contact layer is degraded. Thus, a good ohmic contact cannot be obtained, and the TFT characteristics are degraded.

In addition, when an active layer and an ohmic contact layer are continuously formed without interposing a protection film therebetween, and the ohmic contact layer is patterned, the active layer is required to have a large film thickness because the active layer is etched when the ohmic contact layer is patterned. For this reason, a process for forming the films requires a long time, or the TFT is always set in an ON state. Therefore, the reproducibility of the TFT characteristics is degraded, and productivity and a yield of products are decreased.

As described above, in the conventional TFT, the active layer and the ohmic contact layer cannot be continuously formed, and the active layer is damaged when the protection film is formed. Therefore, perfect ohmic contact is difficult to be obtained between the active layer and the ohmic contact layer, thereby degrading the TFT characteristics.

SUMMARY OF THE INVENTION

The present invention has been made in consideration of the above problem, and has as its object to provide a thin film transistor in which a contact resistance between an active layer and an ohmic contact layer is decreased, and TFT characteristics and mass-productivity are improved.

In order to achieve the above object, there is provided a thin film transistor comprising a silicon active layer, auxiliary film means formed in a surface of source and drain regions of the active layer and consisting of a silicon film doped with nitrogen, source and drain ohmic contact layers contacting the auxiliary film means, source and drain electrodes respectively contacting the source and drain ohmic contact layers, and a gate electrode opposite to a channel region of the active layer through a gate insulating film.

According to a preferable aspect of the present invention, the active layer is formed by micro crystalline silicon or amorphous silicon. A nitrogen concentration of the auxiliary film means may be $10^{18}$ to $10^{19}$ atoms/cc. An additional auxiliary film means may be formed in a surface of a channel region of the active layer and integrated with the auxiliary film means in the source and drain regions of the active layer.

A structure according to the present invention can be applied to inverted stagger, stagger, and coplanar transistors.

According to the thin film transistor of the present invention, since an active layer has an auxiliary film means, the etching resistance of the active layer can be improved without causing a decrease in electric conductivity. As a result, since damage to the surface of the active layer caused by an etching process for a protection film and source and drain electrodes is smaller than that of the conventional technique, a good junction state between the active layer and an ohmic contact layer can be obtained, thereby improving TFT characteristics.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An embodiment of the present invention will be described below with reference to the accompanying drawings.

Figure 1:
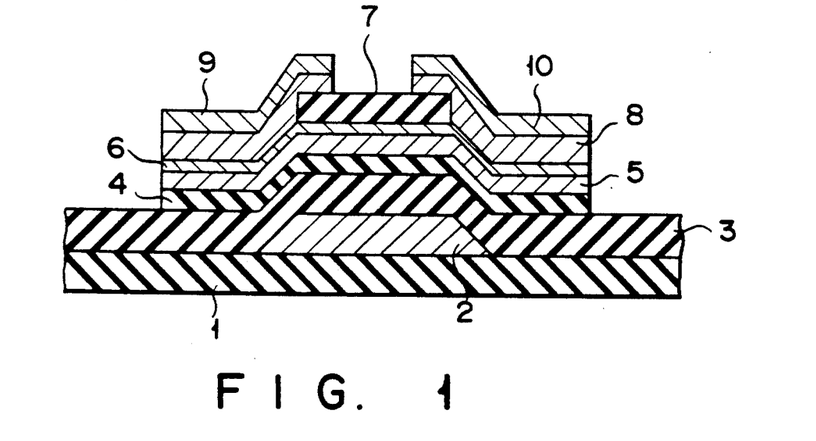
FIG. 1 is a sectional view showing a thin film transistor according to the first embodiment of the present invention.

FIG. 1 is a sectional view showing a thin film transistor according to the first embodiment of the present invention.

A gate electrode 2 having a thickness of 200 nm and made of a Ta film or an MoTa alloy film is formed on a light-transmitting insulating substrate 1 made of a glass substrate A silicon oxide film 3 serving as a first gate insulating film and having a thickness of about 300 nm is formed on the substrate 1 to cover the gate electrode 2. In addition, a silicon nitride film 4 serving as a second gate insulating film is formed on the silicon oxide film 3 to have a thickness of about 50 nm. An undoped a-Si film 5 having a thickness of about 50 nm and formed as an active layer by a photo CVD method and a nitrogen doped a-Si film 6 (nitrogen concentration $1 \times 10^{18}$ atoms/cc) formed by adding ammonia gas to a source gas are sequentially formed on the silicon nitride film 4. A silicon nitride film serving as a protection film 7 and having a thickness of about 100 nm is formed o the surface of the nitrogen doped a-Si film 6 on the gate electrode 2. A multi-layered drain electrode 10 and a multi-layered source electrode 9 each consisting of Al and Mo films and each having a thickness of about 1 $\mu$m are formed on the nitrogen doped a-Si film 6 to have a predetermined distance therebetween. n+-type a-Si films 8 serving as ohmic contact layers and each having a thickness of about 50 nm are formed between the source electrode 9 and the nitrogen doped a-Si film 6 and between the drain electrode 10 and the nitrogen doped a-Si film 6 by a plasma CVD method or the like.

Figure 2A:
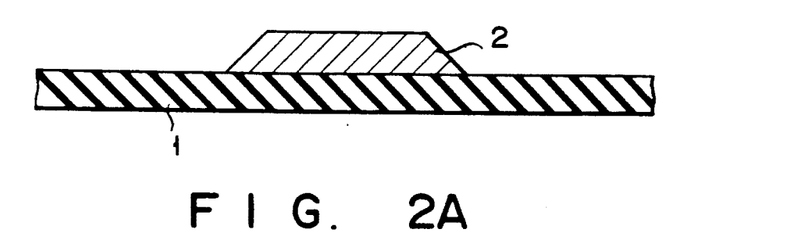
FIGS. 2A to 2E are sectional views showing the steps in manufacturing the thin film transistor shown in FIG. 1.
Figure 2B:
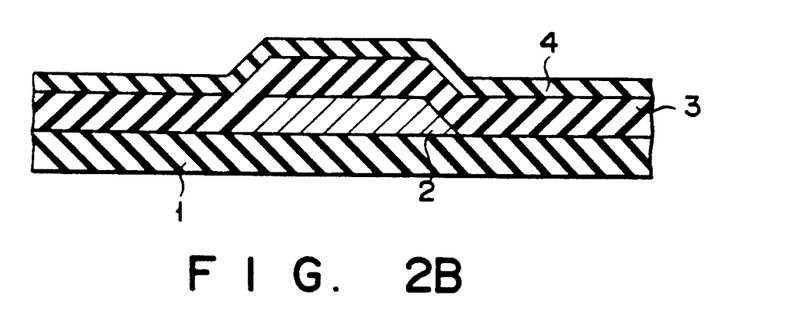
Figure 2C:
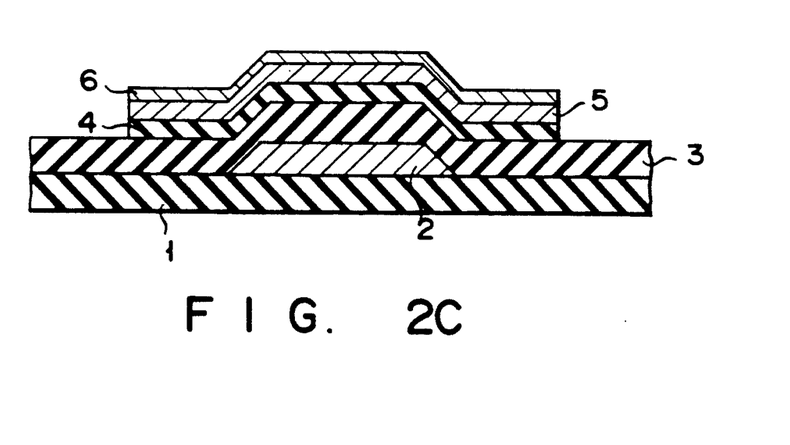
Figure 2D:
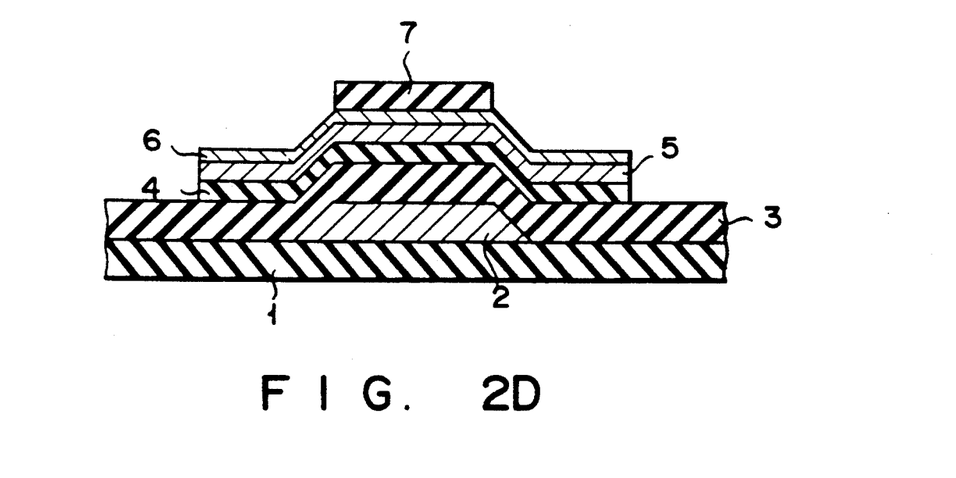
Figure 2E:
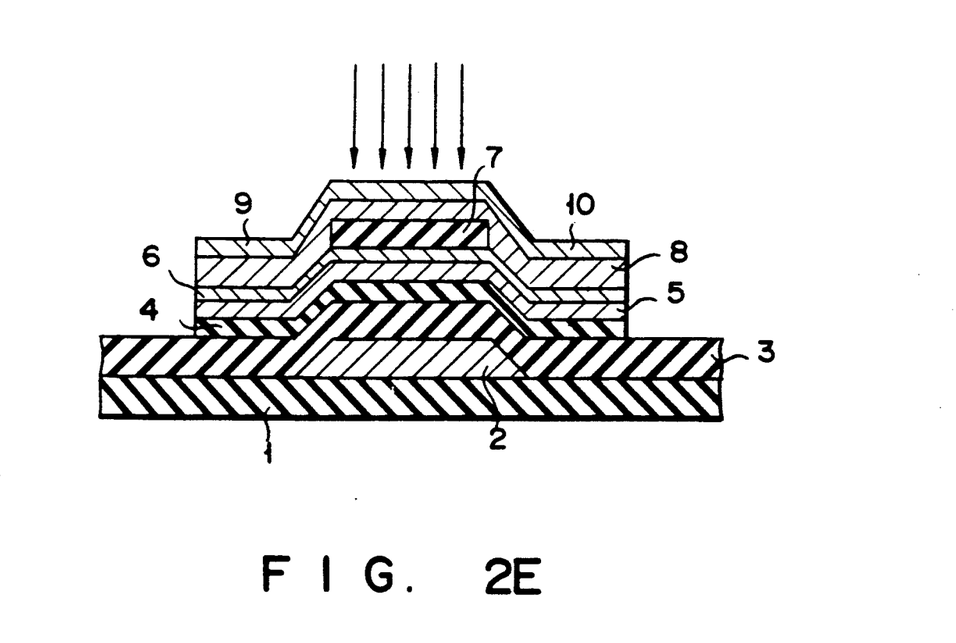

FIGS. 2A to 2E are views showing steps in manufacturing the thin film transistor. FIG. 2A shows the step of forming the gate electrode 2 on the substrate 1, FIG. 2B shows the step of forming the silicon oxide film 3 and the silicon nitride film 4 serving as gate insulating films, FIG. 2C shows the step of forming the undoped a-Si film 5 and the nitrogen doped a-Si film 6 serving as active layers, FIG. 2D shows the step of patterning the protection film 7, and FIG. 2E shows the step of sputtering an electrode metal layer made of Mo and Al films and patterning it to form the source and drain electrodes 9 and 10.

Figure 3:
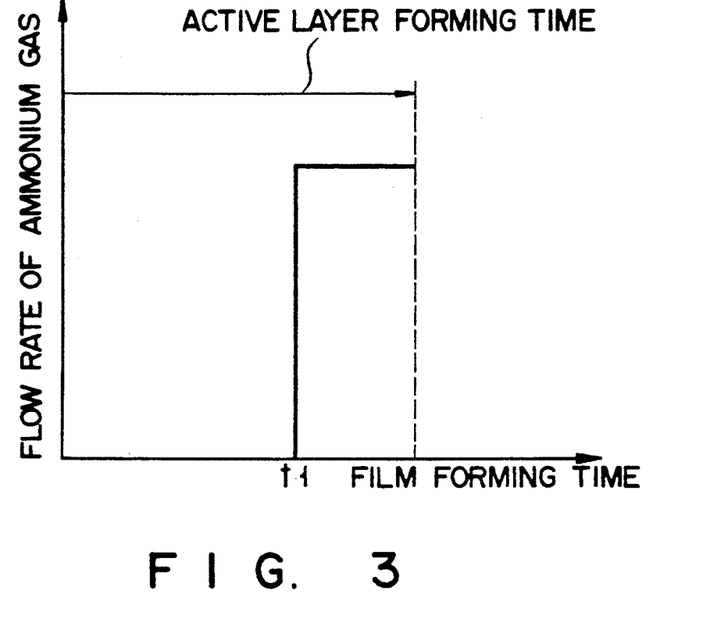
FIG. 3 is a graph showing a relationship between a time required to form the thin transistor shown in FIG. 1 and a flow rate of source gas.
Figure 4:
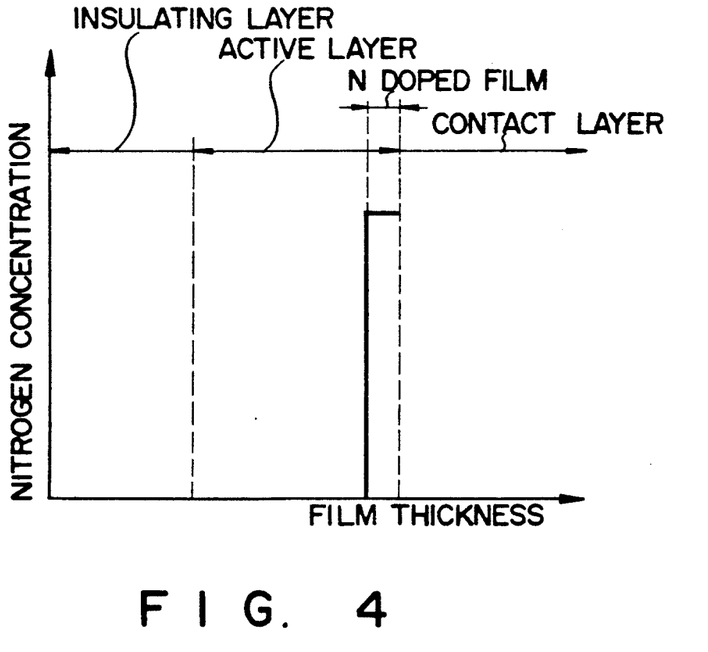
FIG. 4 is a graph showing a nitrogen concentration in the thin film transistor shown in FIG. 1.

As shown in FIG. 3, in the above manufacturing steps, the nitrogen doped a-Si film 6 is formed by supplying ammonia gas to a reaction chamber at a predetermined flow rate from time $t_1$ when the undoped a-Si film 5 is formed to have a thickness of about 50 nm. As shown in FIG. 4, when a nitrogen concentration in these layers was evaluated, it was confirmed that the nitrogen doped a-Si film 6 containing nitrogen having a predetermined concentration was formed. According to an experiment performed by the present inventors, when a nitrogen concentration exceeded $1 \times 10^{20}$ atoms/cc the a-Si film was rapidly changed into an insulating film. However, it was confirmed that an a-Si film having a nitrogen concentration of about $5 \times 10^{17}$ to $5 \times 10^{19}$ atoms/cc effectively decreased the contact resistance. In addition, it was confirmed that the contact resistance was decreased when a nitrogen concentration near the interface between the active layer and the ohmic contact layer was high, even if the thickness of the nitrogen doped a-Si film 6 was decreased.

When the undoped a-Si film 5 and the nitrogen doped a-Si film 6 were formed by a photo CVD method and a plasma CVD method, interface characteristics could be improved by the photo CVD method, since, unlike by the plasma CVD method, no damage caused by charged particles occurred in the interface between the undoped a-Si film 5 and the nitrogen doped a-Si film 6. Therefore, it was confirmed that the field effect mobility of a TFT was increased.

In the thin film transistor with the above structure, since electric contacts between the active layer and the source electrode 9 and between the active layer and the drain electrode 10 are improved compared with a conventional structure, excellent TFT characteristics can be obtained.

A thin film transistor according to the second embodiment of the present invention will now be described below. In this embodiment, unlike in the first embodiment described above, an active layer is formed using micro crystalline silicon ($\mu$c-Si) as a material in place of a-Si. Therefore, since the active layer has the same sectional shape as that of the first embodiment in FIG. 1, a description thereof will be made with reference to FIG. 1.

This embodiment will be described below in accordance with its manufacturing steps. A gate electrode 2 is formed using a metal film such as an MoTa or MoTaCu alloy film having a thickness of about 250 nm on a light-transmitting insulating substrate 1 made of a glass substrate. A silicon oxide film 3 having a thickness of about 250 nm and serving as a first gate insulating film is formed by a thermal CVD method to cover the gate electrode 2. In addition, a silicon oxide film 4 having a thickness of about 50 nm and serving as a second gate insulating film, a micro crystal silicon film 5 ($\mu$c-Si film) having a thickness of about 50 nm and serving as an active layer, and a nitrogen doped a-Si film 6 (nitrogen concentration $1 \times 10^{18}$ atoms/cc) having a thickness of about 10 nm are sequentially formed. A silicon nitride film having a thickness of about 100 nm and serving as a protection film 7 is formed on the nitrogen doped a-Si film 6. The above insulating film 4, the $\mu$c-Si film 5, and the nitrogen doped a-Si film 6 are formed by a plasma CVD method or a photo CVD method. The photo CVD method is preferably used for forming the $\mu$c-Si film 5 and the nitrogen doped a-Si film 6.

The protection film 7 is patterned to expose a part of the nitrogen doped a-Si film 6. Thereafter, an n+-type a-Si film 8 having a thickness of about 50 nm and serving as an ohmic contact layer is formed by, e.g., a plasma CVD method. In addition, a CrAl alloy film having a thickness of about 1 $\mu$m is formed on the n+-type a-Si film 8 by sputtering and is patterned to form source and drain electrodes 9 and 10, thereby obtaining an TFT.

Figure 5:
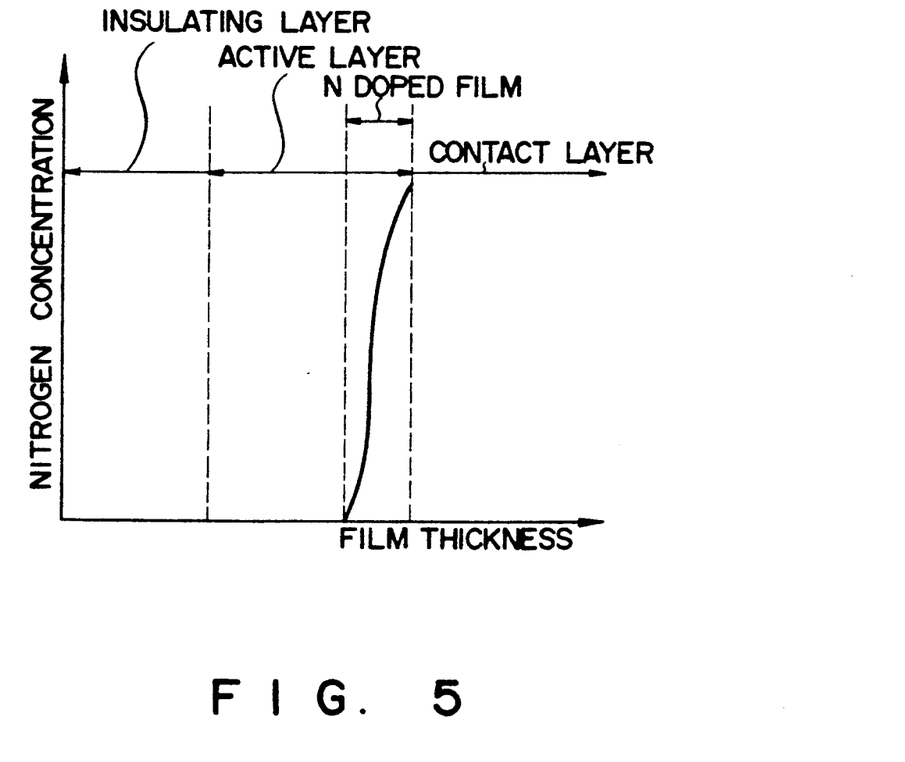
FIG. 5 is a graph showing a nitrogen concentration in a thin film transistor according to the second embodiment of the present invention.

Note that a nitrogen concentration in the nitrogen doped a-Si film 6 has a concentration distribution in a direction of film thickness as shown in FIG. 5.

In the thin film transistor with the above arrangement, since a μc-Si film having an electron mobility larger than that of an a-Si film is used, ohmic contact characteristics are improved, and the field effect mobility of the TFT is greatly increased.

FIGS. 6A to 6E are sectional views showing steps in manufacturing a thin film transistor according to the third embodiment of the present invention. The same reference numerals as in FIG. 1 denote the same parts in FIGS. 6A to 6E, and a detailed description thereof will be omitted.

In this embodiment, unlike in the first embodiment described above, no silicon nitride film serving as the protection film 7 is formed, an undoped a-Si film 5, a nitrogen doped a-Si film 6, and an n+-type a-Si film 8 are sequentially formed, and the n+-type a-Si film 8 is patterned using the nitrogen doped a-Si film 6 as an etching protection film.

Figure 6A:
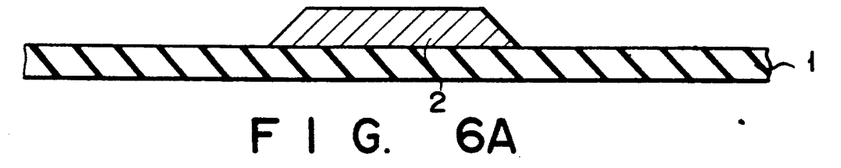
FIGS. 6A to 6E are sectional views showing the steps in manufacturing a thin film transistor according to the third embodiment of the present invention.

This embodiment will be described in accordance with the manufacturing steps. First, a gate electrode 2 is formed on a light-transmitting insulating film 1 using a metal film made of an MoTa or MoTaCu alloy and having a thickness of about 250 nm.

Figure 6B:
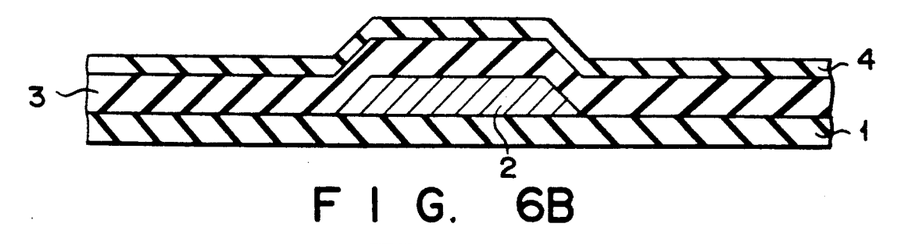

As shown in FIG. 6B, a silicon oxide film 3 having a thickness of about 250 nm and a nitrogen silicon film 4 having a thickness of about 50 nm are sequentially formed on the substrate 1 on which the gate electrode 2 is formed.

Figure 6C:
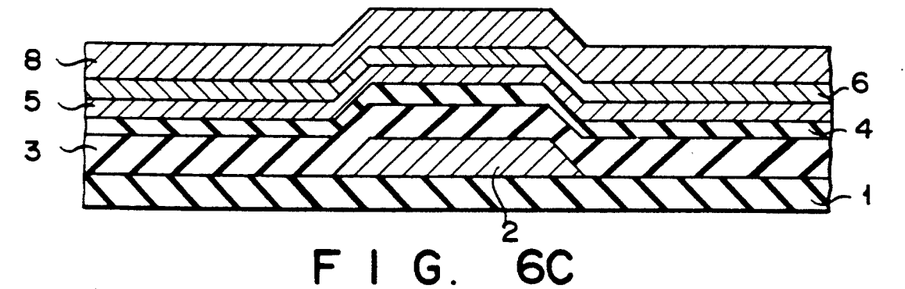

As shown in FIG. 6C, an undoped a-Si film 5 serving as an active layer and having a thickness of about 50 nm and a nitrogen doped a-Si film 6 (nitrogen concentration $1 \times 10^{18}$ atoms/cc) having a thickness of about 10 nm are formed on the nitrogen silicon film 4 using a plasma CVD method or a photo CVD method. Thereafter, an n+-type a-Si film 8 serving as an ohmic contract layer and having a thickness of about 50 nm is formed on the nitrogen doped a-Si film 6 using the plasma CVD method. Note that, as in the first embodiment, the nitrogen doped a-Si film 6 is formed such that a predetermined amount of ammonia gas is supplied to a reaction chamber from a timing at which the thickness of the undoped a-Si film 5 becomes about 50 nm.

Figure 6D:
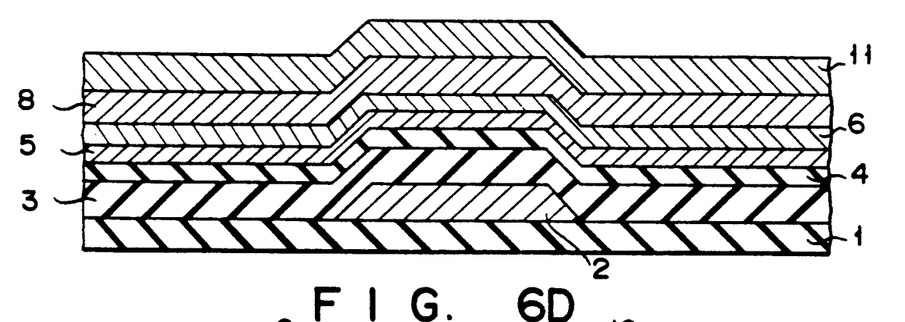

As shown in FIG. 6D, a multi-layered metal film 11 consisting of an Mo film having a thickness of about 50 nm and an Al film having a thickness of about 1 μm is formed on the n+-type a-Si film 8 using sputtering.

Figure 6E:
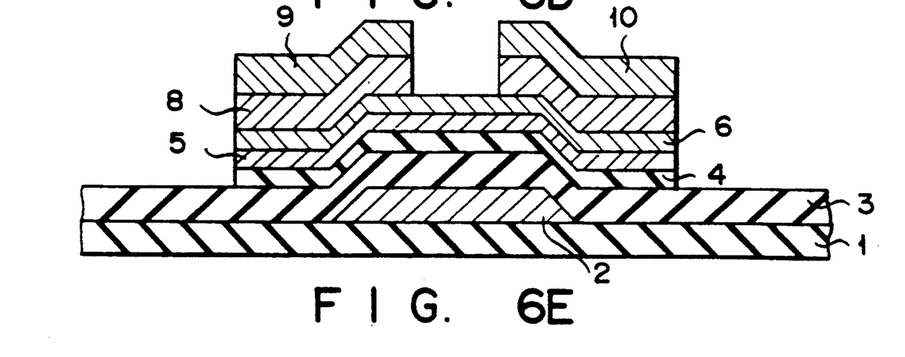

As shown in FIG. 6E, finally, the multi-layered metal film 11 and the n+-type a-Si film 8 are patterned by a microwave excitation etching device to form source and drain electrodes 9 and 10, thereby obtaining a thin film transistor. Note that the etching is performed under the following conditions. That is, CF$_4$ gas at a flow rate of 200 SCCM and O$_2$ gas at a flow rate of 50 SCCM are used as etching gases, a pressure of 30 Pa is held in an etching chamber, and the microwave has a power of 600 w.

Figure 7:
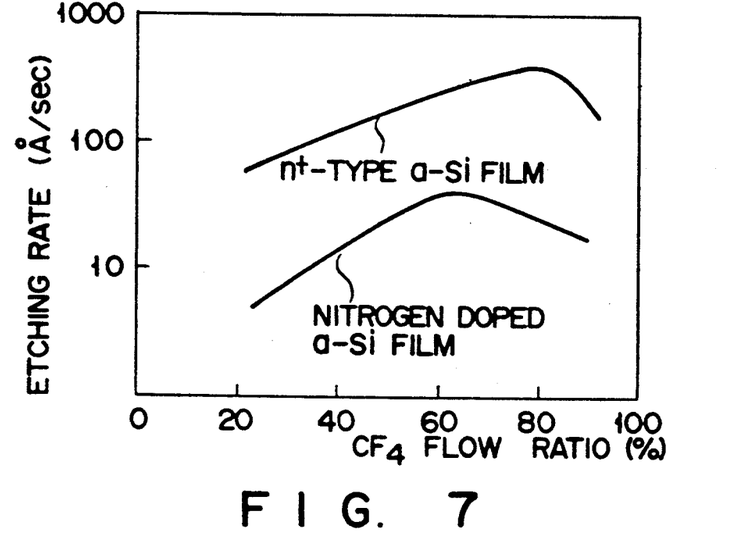
FIG. 7 is a graph showing etching rates of a nitrogen-doped a-Si film and an n+-type a-Si film as a function of a flow ratio of $CF_4$.

FIG. 7 is a graph showing the etching rates of the nitrogen doped a-Si film 6 and the n+-type a-Si film 8 as a function of the percentage of the flow rate of the CF$_4$ gas with respect to the total flow rate (250 SCCM) of the etching gas. As is apparent from the graph, when the percentage of the flow rate of the CF$_4$ gas is 80%, i.e., the flow rate of the CF$_4$ gas is 200 SCCM, a ratio of the etching rate of n+-type a-Si film 8 to that of the nitrogen doped a-Si film 6 is about 10.

In the thin film transistor with the above arrangement, since an etching ratio of the n+-type a-Si film 8 to the nitrogen doped a-Si film 6 can be set to be high, the nitrogen doped a-Si film 6 is used as a protection film. As a result, the undoped a-Si film 5 can be formed to be thin, and a time required for forming the film 5 can be shortened. In addition, unlike a prior art or the first embodiment, the protection film 7 need not be formed, and the number of steps of etching can be reduced, thereby improving mass-productivity.

Since the undoped a-Si film 5, the nitrogen doped a-Si film 6, and the n+-type a-Si film 8 are formed by a continuous deposition step, the interfaces thereof can be covered to be clean, the contact between the undoped a-Si film 5 and the nitrogen doped a-Si film 6 and the contact between the nitrogen doped a-Si film 6 and the n+-type Si film 8 can be satisfactory.

Figure 8:
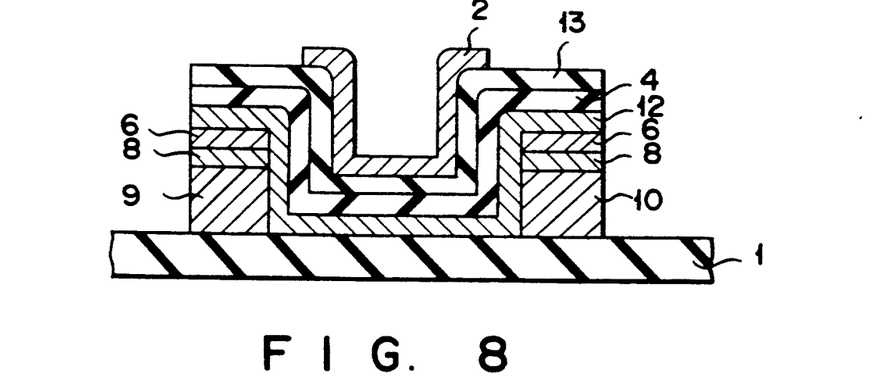
FIG. 8 is a sectional view showing a thin film transistor according to the fourth embodiment of the present invention.

FIG. 8 is a sectional view showing a thin film transistor according to the fourth embodiment of the present invention. In this embodiment, the present invention is applied to a stagger thin film transistor. The embodiment will be described below in accordance with the manufacturing steps.

A CrAl alloy film having a thickness of about 1 μm is formed by vacuum deposition on a light-transmitting insulating substrate 1 made of a glass substrate. An a-Si film 8 serving as an ohmic contact layer and having a thickness of about 50 nm and a nitrogen doped a-Si film 6 (nitrogen concentration $1 \times 10^{18}$ atoms/cc) having a thickness of about 10 nm are sequentially formed on the CrAl alloy film using a plasma CVD method, and these films are patterned to form source and drain electrodes 9 and 10. A polysilicon film 12 serving as an active layer is formed to have a thickness of 250 nm. In addition, a silicon oxide film 3 serving as a second insulating film and having a thickness of about 50 nm is formed, and a tantalum oxide film 13 serving as an insulating film and having a thickness of about 100 nm is formed. A metal film made of Mo or the like and having a thickness of about 250 nm is formed by sputtering. Finally, the metal film is patterned to form a gate electrode 2, thereby completing a TFT.

In the stagger thin film transistor with the above structure, it was confirmed that the ohmic contact layers between the source electrode 9 and the active layer and between the drain electrode 10 and the active layer were largely improved as compared with a conventional structure, and the transistor had excellent TFT characteristics.

Figure 9:
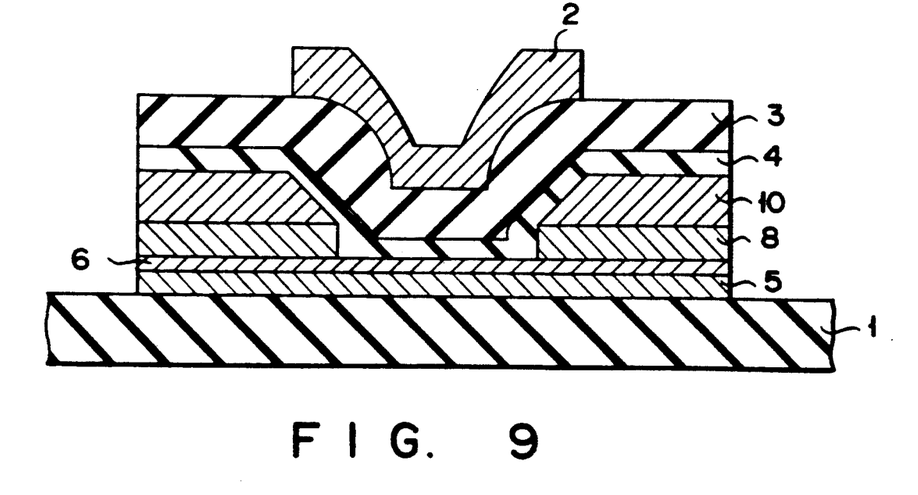
FIG. 9 is sectional view showing a coplanar thin film transistor according to the fifth embodiment of the present invention.

The present invention is not limited to the above embodiments. The present invention can be applied not only to the inverted stagger TFTs of the first to third embodiments and to the stagger TFT of the fourth embodiment but to the coplanar TFT. A structure obtained by applying the arrangement and the manufacturing method of the present invention to a coplanar TFT is shown in FIG. 9. The reference numerals as in FIG. 1 denote the same parts in FIG. 9. An insulating film used in this embodiment may be made of silicon carbide or the like. Various modifications can be made in the art without departing from the scope or spirit of the present invention.

As described above, according to the present invention, since the nitrogen doped a-Si film and the ohmic contact layer in the active layer ar bonded to each other, the contact resistance can be decreased, and a time required for forming the films can be shortened. Therefore, mass production of highly reliable thin film transistors can be performed.

According to the method of manufacturing the above thin film transistor, since nitrogen is contained in non-single-crystalline silicon to decrease the etching resistance of a non-single-crystalline film, a junction state between a non-single-crystalline silicon film and an ohmic contact layer, and TFT characteristics can be improved. In addition, the non-single-crystalline silicon film to the ohmic contact layer can be continuously formed without causing any disadvantage such that the TFT is always set in an ON state due to an increase in thickness of the non-single-crystalline silicon film. Therefore, the steps of forming and patterning a protection film can be omitted, and the state of the interface between the non-single-crystalline silicon film containing nitrogen and the contact layer can be improved, thereby improving reliability and mass-productivity of TFTs.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A thin film transistor comprising:
   a silicon active layer including source and drain regions and a channel region formed between and connecting the source and drain regions;
   an electrically conductive auxiliary film comprising a silicon film doped with nitrogen, and formed on surfaces of the source, channel, and drain regions of the active layer, a nitrogen concentration in the auxiliary film having a distribution in a direction of film thickness such that the nitrogen concentration is gradually reduced toward the active layer;
   source and drain ohmic contact layers separated from each other and formed on and contacting separate parts of a surface of the auxiliary film corresponding to the source and drain regions, respectively;
   source and drain electrodes contacting the source and drain ohmic contact layers, respectively; and
   a gate electrode opposite to the channel region of the active layer with a gate insulating film interposed therebetween.

2. A transistor according to claim 1, further comprising a protection film formed on part of a surface of the auxiliary film corresponding to the channel region.

3. A transistor according to claim 2, wherein the protection film comprises a silicon nitride film.

4. A transistor according to claim 1, wherein the nitrogen concentration in the auxiliary film is $5 \times 10^{17}$ atoms/cc to $1 \times 10^{20}$ atoms/cc.

5. A transistor according to claim 2, wherein the nitrogen concentration in the auxiliary film is $5 \times 10^{17}$ atoms/cc to $5 \times 10^{19}$ atoms/cc.

6. A transistor according to claim 1, wherein the gate insulating film comprises a silicon oxide film contacting the gate electrode and a silicon nitride film contacting the active layer.

7. A transistor according to claim 1, wherein the source and drain ohmic contact layers each have extensional portions which extend and terminate above the channel region such that respective ends of the extensional portions face each other above the channel region.

8. A transistor according to claim 7, wherein the source and drain electrodes each have ends aligning with the ends of the extensional portions of the source and drain ohmic contact layers, respectively, and facing each other above the channel region.

9. An inverted staggered thin film transistor comprising:
   a silicon active layer including source and drain regions and a channel region formed between and connecting the source and drain regions;
   an electrically conductive auxiliary film comprising a silicon film doped with nitrogen, and formed on surfaces of the source, channel, and drain regions of the active layer, a nitrogen concentration in the auxiliary film having a distribution in a direction of film thickness such that the nitrogen concentration is gradually reduced toward the active layer;
   source and drain ohmic contact layers separated from each other and formed on and contacting separate parts of a surface of the auxiliary film corresponding to the source and drain regions, respectively;
   source and drain electrodes contacting the source and drain ohmic contact layers, respectively; and
   a gate electrode opposite to the channel region of the active layer with a gate insulating film interposed therebetween.

10. A transistor according to claim 9, further comprising a protection film formed on part of a surface of the auxiliary film corresponding to the channel region.

11. A transistor according to claim 10, wherein the protection film comprises a silicon nitride film.

12. A transistor according to claim 9, wherein the nitrogen concentration in the auxiliary film is $5 \times 10^{17}$ atoms/cc to $1 \times 10^{20}$ atoms/cc.

13. A transistor according to claim 11, wherein the source and drain ohmic contact layers each have extensional portions which extend onto and terminate on the protection film such that respective ends of the extensional portions face each other on the protection film.

14. A transistor according to claim 13, wherein the source and drain electrodes each have ends aligning with the ends of the extensional portions of the source and drain ohmic contact layers, respectively, and facing each other on the protection film.

* * * * *